United States Patent
Li et al.

(10) Patent No.: US 11,764,061 B2
(45) Date of Patent: Sep. 19, 2023

(54) WATER SOLUBLE ORGANIC-INORGANIC HYBRID MASK FORMULATIONS AND THEIR APPLICATIONS

(71) Applicant: Applied Materials, Inc., Santa Clara, CA (US)

(72) Inventors: Wenguang Li, Santa Clara, CA (US); James S. Papanu, San Rafael, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/529,130

(22) Filed: Nov. 17, 2021

(65) Prior Publication Data
US 2022/0076944 A1    Mar. 10, 2022

Related U.S. Application Data

(62) Division of application No. 16/777,610, filed on Jan. 30, 2020, now Pat. No. 11,211,247.

(51) Int. Cl.
| | | |
|---|---|---|
| H01L 21/027 | (2006.01) | |
| H01L 21/3065 | (2006.01) | |
| H01L 21/78 | (2006.01) | |
| H01L 21/308 | (2006.01) | |
| H01L 21/822 | (2006.01) | |

(52) U.S. Cl.
CPC ...... H01L 21/0275 (2013.01); H01L 21/3065 (2013.01); H01L 21/3081 (2013.01); H01L 21/3086 (2013.01); H01L 21/30655 (2013.01); H01L 21/78 (2013.01); H01L 21/822 (2013.01)

(58) Field of Classification Search
None
See application file for complete search history.

(56) References Cited

U.S. PATENT DOCUMENTS

| | | | |
|---|---|---|---|
| 4,049,944 A | 9/1977 | Garvin et al. | |
| 5,593,606 A | 1/1997 | Owen et al. | |
| 6,020,093 A * | 2/2000 | Shibuya | G03F 7/012 430/196 |
| 6,057,180 A | 5/2000 | Sun et al. | |
| 6,174,271 B1 | 1/2001 | Kosmowski | |

(Continued)

FOREIGN PATENT DOCUMENTS

| | | | | |
|---|---|---|---|---|
| GB | 2102138 A | * | 6/1982 | ............... G03C 1/72 |
| JP | 9216085 | | 8/1997 | |

(Continued)

OTHER PUBLICATIONS

International Preliminary Report on Patentability from Application No. PCT/US2021/012352 dated Aug. 11, 2022, 5 pgs.

(Continued)

*Primary Examiner* — Jiong-Ping Lu
(74) *Attorney, Agent, or Firm* — Schwabe, Williamson & Wyatt, P.C.

(57) ABSTRACT

Water soluble organic-inorganic hybrid masks and mask formulations, and methods of dicing semiconductor wafers are described. In an example, a mask for a wafer singulation process includes a water-soluble matrix based on a solid component and water. A p-block metal compound, an s-block metal compound, or a transition metal compound is dissolved throughout the water-soluble matrix.

22 Claims, 8 Drawing Sheets

FLOWCHART 100

(56) References Cited

U.S. PATENT DOCUMENTS

| | | |
|---|---|---|
| 6,306,731 B1 | 10/2001 | Igarashi et al. |
| 6,407,363 B2 | 6/2002 | Dunsky et al. |
| 6,465,158 B1 | 10/2002 | Sekiya |
| 6,528,864 B1 | 3/2003 | Arai |
| 6,574,250 B2 | 6/2003 | Sun et al. |
| 6,582,983 B1 | 6/2003 | Runyon et al. |
| 6,593,542 B2 | 7/2003 | Baird et al. |
| 6,642,127 B2 | 11/2003 | Kumar et al. |
| 6,676,878 B2 | 1/2004 | O'Brien et al. |
| 6,696,669 B2 | 2/2004 | Hembree et al. |
| 6,706,998 B2 | 3/2004 | Cutler |
| 6,759,275 B1 | 7/2004 | Lee et al. |
| 6,803,247 B2 | 10/2004 | Sekiya |
| 6,887,804 B2 | 5/2005 | Sun et al. |
| 6,998,571 B2 | 2/2006 | Sekiya et al. |
| 7,128,806 B2 | 10/2006 | Nguyen et al. |
| 7,129,150 B2 | 10/2006 | Kawai |
| 7,179,723 B2 | 2/2007 | Genda et al. |
| 7,265,033 B2 | 9/2007 | Shigematsu et al. |
| 7,364,986 B2 | 4/2008 | Nagai et al. |
| 7,435,607 B2 | 10/2008 | Nagai |
| 7,459,377 B2 | 12/2008 | Ueda et al. |
| 7,468,309 B2 | 12/2008 | Shigematsu et al. |
| 7,473,866 B2 | 1/2009 | Morishige et al. |
| 7,507,639 B2 | 3/2009 | Nakamura |
| 7,629,228 B2 | 12/2009 | Haji et al. |
| 7,678,670 B2 | 3/2010 | Arita et al. |
| 7,687,740 B2 | 3/2010 | Bruland et al. |
| 7,754,584 B2 | 7/2010 | Kumakawa |
| 7,767,551 B2 | 8/2010 | Arita et al. |
| 7,767,554 B2 | 8/2010 | Arita et al. |
| 7,776,720 B2 | 8/2010 | Boyle et al. |
| 7,838,323 B2 | 11/2010 | Utsumi et al. |
| 7,859,084 B2 | 12/2010 | Utsumi et al. |
| 7,875,898 B2 | 1/2011 | Maeda |
| 7,906,410 B2 | 3/2011 | Arita et al. |
| 7,923,351 B2 | 4/2011 | Arita |
| 7,927,973 B2 | 4/2011 | Haji et al. |
| 2003/0162313 A1 | 8/2003 | Kim et al. |
| 2004/0080045 A1 | 4/2004 | Kimura et al. |
| 2004/0137700 A1 | 7/2004 | Sekiya |
| 2006/0043535 A1 | 3/2006 | Hiatt |
| 2006/0205182 A1 | 9/2006 | Soejima |
| 2009/0255911 A1 | 10/2009 | Krishnaswami et al. |
| 2011/0312157 A1 | 12/2011 | Lei et al. |
| 2014/0273401 A1 | 9/2014 | Lei et al. |
| 2015/0011073 A1 | 1/2015 | Lei et al. |
| 2015/0162243 A1 | 6/2015 | Kumar et al. |

FOREIGN PATENT DOCUMENTS

| | | |
|---|---|---|
| JP | 10321908 | 12/1998 |
| JP | 2001127011 | 5/2001 |
| JP | 2001144126 | 5/2001 |
| JP | 2003179005 | 6/2003 |
| JP | 2004031526 | 1/2004 |
| JP | 2004055684 | 2/2004 |
| KR | 10-2015-0048197 | 5/2015 |
| KR | 10-2016-0055933 | 5/2016 |
| WO | WO-03036712 | 5/2003 |
| WO | WO-03071591 | 5/2003 |

OTHER PUBLICATIONS

Linder, V. et al., "Water-Soluble Sacrificial Layers for Surface Micromachining", www.small-journal.com, 2005, 1, No. 7, 7 pgs.

Singh, Saravjeet et al., "Apparatus and Methods for Dry Etch With Edge, Side and Back Protection", U.S. Appl. No. 61/491,693, filed May 31, 2011 24 pgs.

International Search Report and Written Opinion from Application No. PCT/US2021/012352 dated Apr. 29, 2021, 8 pgs.

\* cited by examiner

| Materials Ratio by weight | Etched Trench Depth in Si (um) | Mark loss during etch (um) | Selectivity = Etch Depth/Mask Loss |
|---|---|---|---|
| PVA (reference no metal compound) | 110 | 6.8 | 16:1 |
| Al-PVA 1:2 | 140 | 1.0 | 140:1 |
| Al-PVA 1:3 | 135 | 1.2 | 112:1 |
| Al-PVA 1:4 | 130 | 1.4 | 93:1 |
| Al-PVA 1:6 | 130 | 3.6 | 36:1 |
| Al-PVA-PVP 1:2:1 | 140 | 1.1 | 127:1 |

300

PVA is poly(vinyl alcohol)
PVP is poly(vinyl pyrrolidone)
Al is aluminum acetate dibasic, stabilized by boric acid

FIG. 3

WATER SOLUBLE ORGANIC-INORGANIC HYBRID MASK FORMULATIONS AND THEIR APPLICATIONS

CROSS-REFERENCE TO RELATED APPLICATIONS

This application is a divisional of U.S. patent application Ser. No. 16/777,610, filed on Jan. 30, 2020, the entire contents of which are hereby incorporated by reference herein.

BACKGROUND

1) Field

Embodiments of the present disclosure pertain to the field of semiconductor processing and, in particular, to methods of dicing semiconductor wafers, each wafer having a plurality of integrated circuits thereon.

2) Description of Related Art

In semiconductor wafer processing, integrated circuits are formed on a wafer (also referred to as a substrate) composed of silicon or other semiconductor material. In general, layers of various materials which are either semiconducting, conducting or insulating are utilized to form the integrated circuits. These materials are doped, deposited and etched using various well-known processes to form integrated circuits. Each wafer is processed to form a large number of individual regions containing integrated circuits known as dice.

Following the integrated circuit formation process, the wafer is "diced" to separate the individual die from one another for packaging or for use in an unpackaged form within larger circuits. The two main techniques that are used for wafer dicing are scribing and sawing. With scribing, a diamond tipped scribe is moved across the wafer surface along pre-formed scribe lines. These scribe lines extend along the spaces between the dice. These spaces are commonly referred to as "streets." The diamond scribe forms shallow scratches in the wafer surface along the streets. Upon the application of pressure, such as with a roller, the wafer separates along the scribe lines. The breaks in the wafer follow the crystal lattice structure of the wafer substrate. Scribing can be used for wafers that are about 10 mils (thousandths of an inch) or less in thickness. For thicker wafers, sawing is presently the preferred method for dicing.

With sawing, a diamond tipped saw rotating at high revolutions per minute contacts the wafer surface and saws the wafer along the streets. The wafer is mounted on a supporting member such as an adhesive film stretched across a film frame and the saw is repeatedly applied to both the vertical and horizontal streets. One problem with either scribing or sawing is that chips and gouges can form along the severed edges of the dice. In addition, cracks can form and propagate from the edges of the dice into the substrate and render the integrated circuit inoperative. Chipping and cracking are particularly a problem with scribing because only one side of a square or rectangular die can be scribed in the <110> direction of the crystalline structure. Consequently, cleaving of the other side of the die results in a jagged separation line. Because of chipping and cracking, additional spacing is required between the dice on the wafer to prevent damage to the integrated circuits, e.g., the chips and cracks are maintained at a distance from the actual integrated circuits. As a result of the spacing requirements, not as many dice can be formed on a standard sized wafer and wafer real estate that could otherwise be used for circuitry is wasted. The use of a saw exacerbates the waste of real estate on a semiconductor wafer. The blade of the saw is approximate 15 microns thick. As such, to insure that cracking and other damage surrounding the cut made by the saw does not harm the integrated circuits, 60 to five hundred microns often must separate the circuitry of each of the dice. Furthermore, after cutting, each die requires substantial cleaning to remove particles and other contaminants that result from the sawing process.

Plasma dicing has also been used, but may have limitations as well. For example, one limitation hampering implementation of plasma dicing may be cost. A standard lithography operation for patterning resist may render implementation cost prohibitive. Another limitation possibly hampering implementation of plasma dicing is that plasma etching of commonly encountered metals (e.g., copper) in dicing along streets can create production issues or throughput limits.

SUMMARY

Embodiments of the present disclosure include methods of, and apparatuses for, dicing semiconductor wafers.

In an embodiment, a mask for a wafer singulation process includes a water-soluble matrix based on a solid component and water. A p-block metal compound, an s-block metal compound, or a transition metal compound is dissolved throughout the water-soluble matrix. The water soluble polymers and the metal compounds need to meet the following conditions:

In another embodiment, a method of dicing a semiconductor wafer including a plurality of integrated circuits involves forming a mask above the semiconductor wafer. The mask includes a water-soluble matrix based on a solid component and water, and a p-block metal compound, an s-block metal compound, or a transition metal compound dissolved throughout the water-soluble matrix. The mask and a portion of the semiconductor wafer are patterned with a laser scribing process to provide a patterned mask with gaps and corresponding trenches in the semiconductor wafer in regions between the integrated circuits. The semiconductor wafer is plasma etched through the gaps in the patterned mask to extend the trenches and to singulate the integrated circuits. The patterned mask protects the integrated circuits during the plasma etching.

In another embodiment, a method of dicing a semiconductor wafer including a plurality of integrated circuits involves forming a mask above the semiconductor wafer. The mask includes a water-soluble matrix based on a solid component and water, and a p-block metal compound, an s-block metal compound, or a transition metal compound dissolved throughout the water-soluble matrix. The mask is patterned and the integrated circuits of the semiconductor wafer are singulated with a plasma etching process. The patterned mask protects the integrated circuits during the plasma etching.

BRIEF DESCRIPTION OF THE DRAWINGS

FIG. 3 is a Table including parameters of materials ratio by weight, etched trench depth in silicon, mark loss during etch, and etch selectivity, in accordance with an embodiment of the present disclosure.

DETAILED DESCRIPTION

Figure 1:
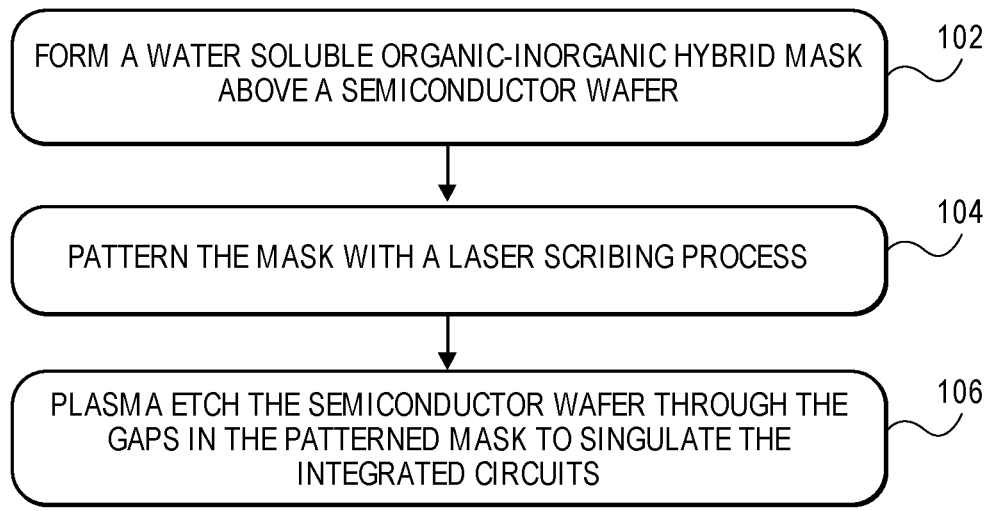
FIG. 1 is a Flowchart representing operations in a method of dicing a semiconductor wafer including a plurality of integrated circuits, in accordance with an embodiment of the present disclosure.

Methods of dicing semiconductor wafers, each wafer having a plurality of integrated circuits thereon, are described. In the following description, numerous specific details are set forth, such as etch-resistant mask materials and treatments, laser scribing conditions, and plasma etching conditions and material regimes, in order to provide a thorough understanding of embodiments of the present disclosure. It will be apparent to one skilled in the art that embodiments of the present disclosure may be practiced without these specific details. In other instances, well-known aspects, such as integrated circuit fabrication, are not described in detail in order to not unnecessarily obscure embodiments of the present disclosure. Furthermore, it is to be understood that the various embodiments shown in the Figures are illustrative representations and are not necessarily drawn to scale.

One or more embodiments are directed particularly to using metal compounds to enhance the etch selectivity and the prevent plasma damage to the wafers to reduce plasma damage, erosion, consumption, etching, or thickness loss of etch masks. Embodiments may be applicable to laser and etch wafer dicing approaches and tooling for singulation or dicing of electronic device wafers.

To provide context, most water-soluble polymers, such as polyvinyl alcohol, do not have high resistance to plasma etch processing. On the other hand, aromatic polymers that have good etch resistance are typically not soluble in water. It would be advantageous to enhance the selectivity of an etch mask without sacrificing water solubility. Etch selectivity may be defined as the ratio of the amount of substrate material (e.g., Si) removed to the amount of mask loss during the etch process. Water soluble polymers typically have relatively low selectivity, and it may be advantageous to enhance the selectivity of the mask without sacrificing water solubility. A state-of-art approach to address the above issues involves implementation of a composite mask with water soluble polymers and particle dispersions. Such a mask based on particle dispersions is not truly water soluble, and often is associated with short shelf life. Additionally, the particle dispersions typically have a narrow pH range of stability. Finally, such a dry mask cannot be re-dissolved or re-dispersed.

In accordance with an embodiment of the present disclosure, water soluble organic-inorganic hybrid masks and mask formulations for plasma dicing are described. Such hybrid masks have high etch selectivity and are water soluble. In a particular embodiment, an organic-inorganic hybrid mask is composed of water soluble polymers and metal compounds. An etch selectivity to halogen-based etch processes, especially fluorine based etch processes, of the hybrid mask is about ten times higher than the polymer-only mask. The hybrid mask is highly transparent and can be re-dissolved in water. Advantages of embodiments described herein provide an etch mask with high etch selectivity, that is water soluble, that has a long shelf life, that has better transparency, and that is stable at a wide pH range. Embodiments may address potential needs for improved etch resistance in a water soluble dicing mask. In a specific example, a polyvinyl alcohol (PVA) matrix with a metal compound dissolved therein is provided as an etch mask.

To provide context, during singulation of a wafer into individual die, the wafer is cut or sectioned along dicing streets between the dies. Traditionally, dicing has been performed with a mechanical saw. Mobile devices and other technology drivers may require more advanced singulation approaches to reduce cracking, delamination, and chipping defects. A laser and etch wafer dicing approach may involve applying a water soluble protective coating to a substrate, removing the coating any device test layers in the street regions removed by laser scribing to open up the underlying substrate material, which is typically silicon (Si). The exposed Si is then plasma etched through its entire thickness to singulate the wafer into the individual die. The protective coating is removed in a deionized (DI) water based cleaning operation. Water soluble protective coatings may be desirable due to environmental considerations and ease of processing. Such a water soluble coating may primarily be used as an etch mask during the plasma etching step, and also as a layer that collects any debris generated during laser scribing.

To provide further context, femtosecond lasers may be preferred in the laser scribing portion of the process. Unlike nanosecond and other long pulse lasers, femtosecond lasers have little heat effect because of the associated ultra-short pulses. Another advantage of femtosecond lasers may be the capability to remove most materials including absorptive, reflective and transparent materials. On typical wafers, there are metals which are reflective and absorptive, the dielectrics which are transparent, and the silicon substrate which is absorptive to most laser light. The water-soluble protective coating is totally or mostly transparent. It is to be appreciated that dye may be added to the mask formulation to enhance the laser coupling to the mask layer, but the mask layer may be transparent for optical alignment, etc. These listed materials can be ablated by femtosecond lasers.

It is to be appreciated that although many embodiments described below are associated with femto-second laser scribing, in other embodiments, laser scribing with other laser beam types may also be compatible with masking materials described herein. It is also to be appreciated that although many embodiments described below are associated with scribing streets having metallized features, in other embodiments, metal free scribing streets may also be considered.

Figure 2A:
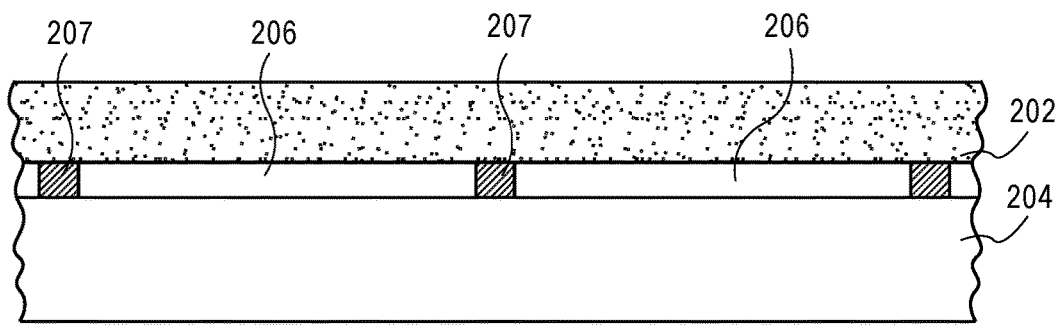
FIG. 2A illustrates a cross-sectional view of a semiconductor wafer including a plurality of integrated circuits during performing of a method of dicing the semiconductor wafer, corresponding to operations 102 of the Flowchart of FIG. 1, in accordance with an embodiment of the present disclosure.
Figure 2B:
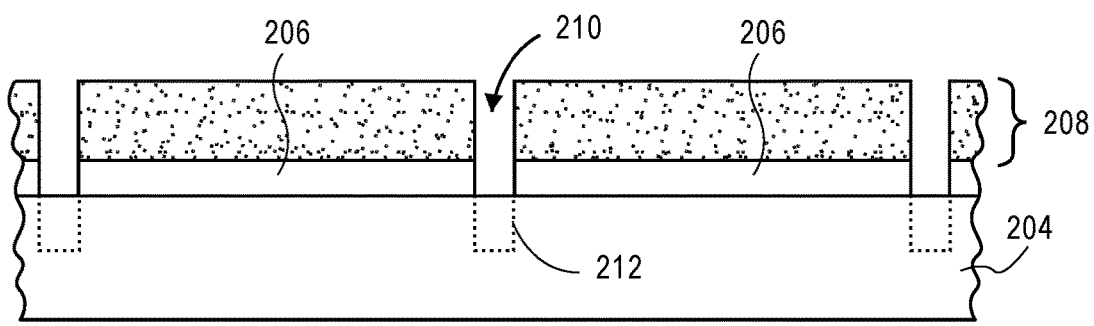
FIG. 2B illustrates a cross-sectional view of a semiconductor wafer including a plurality of integrated circuits during performing of a method of dicing the semiconductor wafer, corresponding to operation 104 of the Flowchart of FIG. 1, in accordance with an embodiment of the present disclosure.
Figure 2C:
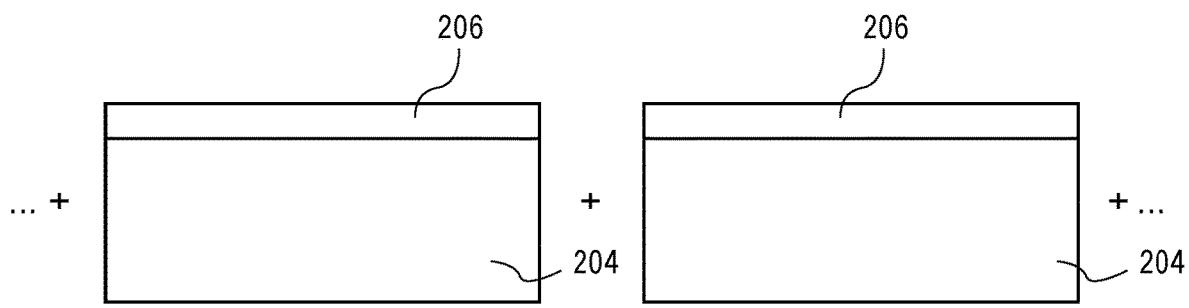
FIG. 2C illustrates a cross-sectional view of a semiconductor wafer including a plurality of integrated circuits during performing of a method of dicing the semiconductor wafer, corresponding to operation 106 of the Flowchart of FIG. 1, in accordance with an embodiment of the present disclosure.

As such, in an aspect of the present disclosure, a water soluble organic-inorganic hybrid mask is used for a singulation process based on a combination of a laser scribing process with a plasma etching process to dice a semiconductor wafer into singulated integrated circuits. FIG. 1 is a Flowchart 100 representing operations in a method of dicing a semiconductor wafer including a plurality of integrated circuits, in accordance with an embodiment of the present disclosure. FIGS. 2A-2C illustrate cross-sectional views of a semiconductor wafer including a plurality of integrated circuits during performing of a method of dicing the semiconductor wafer, corresponding to operations of Flowchart 100, in accordance with an embodiment of the present disclosure.

Referring to operation 102 of Flowchart 100, and corresponding FIG. 2A, a mask 202 is formed above a semiconductor wafer or substrate 204. The mask 202 covers and protects integrated circuits 206 formed on the surface of semiconductor wafer 204. The mask 202 also covers intervening streets 207 formed between each of the integrated circuits 206. In an embodiment, the mask 202 includes a water-soluble matrix based on a solid component and water, and a p-block metal compound, an s-block metal compound, or a transition metal compound dissolved throughout the water-soluble matrix.

In one embodiment, the water soluble matrix is a polyvinyl alcohol (PVA)-based water soluble matrix, where the PVA is the solid component. In another embodiment, the solid component for the water soluble matrix is selected from the group consisting of polyethylene oxide, polyethylene glycol, polyacryclic acid, polyacrylamide, polystyrene-maleic acid copolymer, hydroxyethyl cellulose and hydroxyethyl starch. In one embodiment, the water-soluble matrix includes approximately 10-40 weight % of the solid component with the remainder water.

In one embodiment, forming the mask 202 above the semiconductor wafer 204 includes spin-coating the mask 202 on the semiconductor wafer 204. Other approaches may include slot die coating, spray coating, etc. In a specific embodiment, prior to coating, a plasma or chemical pre-treatment is performed to enable better wettability and coating of the wafer.

In an embodiment, mask 202 is a water soluble mask in that it is readily dissolvable in an aqueous media. For example, in one embodiment, the as-deposited water-soluble mask 202 is composed of a material that is soluble in one or more of an alkaline solution, an acidic solution, or in deionized water. In another embodiment, the as-deposited water-soluble mask 202 is soluble in polar organic solvents, such as isopropyl alcohol.

In an embodiment, mask 202 is fabricated using the following operations: (1) dissolve water soluble polymers, such as polyvinyl alcohol, polyvinyl pyrrolidone, polyethylene oxide, polyethylene glycol, or polyacrylamide, in water, (2) dissolve a metal compound such as aluminum acetate dibasic, in water, and (3) mix the polymer solution and the metal compound solution. Additional operations may include adding other additives. In one embodiment, the anion is an acetate anion ($CH_3COO^-$) and the metal compound is dibasic. The metal of the metal compound may be a p-block metal (such as aluminum or tin), an s-block metal (such as potassium or calcium) or a transition metal (such as copper, nickel, silver, or chromium). Such p-block metal compounds or s-block metal compounds or transition metal compounds may be distinguished from metal oxides.

In an embodiment, the composition of mask 202 includes water soluble polymers, examples of which include poly (vinyl Alcohol) PVA, poly(vinyl pyrrolidone) PVP, poly (ethylene oxide) PEO, poly(ethylene glycol) PEG, polyacrylamide, poly(2-ethyl-2-oxazoline). The composition of mask 202 may further include water soluble metal compounds from metals that cannot be etched by fluorine such as aluminum, tin, copper, nickel, silver, or chromium. The composition of mask 202 may further include other additives, such as adhesion promotors, defoamers, light absorbers, and/or amines to adjust pH. In an embodiment, the water soluble polymers and metal compounds meet the following requirements: (1) form a homogenous solution in water, and (2) when the solution is dried, the resultant forms a homogenous film with good optical clarity and transparency. In a particular embodiment mask 202 is a water soluble polymer and metal compound combination of poly(vinyl alcohol) and aluminum acetate dibasic.

In accordance with an embodiment of the present disclosure, the mask 202 includes a water-soluble matrix based on a solid component and water, and a p-block metal compound, an s-block metal compound, or a transition metal compound dissolved throughout the water-soluble matrix. In one embodiment, the p-block metal compound includes an aluminum cation or a tin cation. In one embodiment, the s-block metal compound includes a potassium cation or a calcium cation. In one embodiment, the transition metal compound includes a copper cation, a nickel cation, a silver cation, or a chromium cation. In one embodiment, the p-block metal compound, the s-block metal compound, or the transition metal compound includes an acetate anion. In one embodiment, the solid component of the water-soluble matrix is poly(vinyl alcohol) (PVA). In one such embodiment, the water-soluble matrix further includes poly(vinyl pyrrolidone). In one such embodiment, the water-soluble matrix further includes a dye, a corrosion inhibitor, or a pH adjuster.

In an embodiment, semiconductor wafer or substrate 204 is composed of a material suitable to withstand a fabrication process and upon which semiconductor processing layers may suitably be disposed. For example, in one embodiment, semiconductor wafer or substrate 204 is composed of a group IV-based material such as, but not limited to, crystalline silicon, germanium or silicon/germanium. In a specific embodiment, providing semiconductor wafer 204 includes providing a monocrystalline silicon substrate. In a particular embodiment, the monocrystalline silicon substrate is doped with impurity atoms. In another embodiment, semiconductor wafer or substrate 204 is composed of a III-V material such as, e.g., a III-V material substrate used in the fabrication of light emitting diodes (LEDs).

In an embodiment, semiconductor wafer or substrate 204 has disposed thereon or therein, as a portion of the integrated circuits 206, an array of semiconductor devices. Examples of such semiconductor devices include, but are not limited to, memory devices or complimentary metal-oxide-semiconductor (CMOS) transistors fabricated in a silicon substrate and encased in a dielectric layer. A plurality of metal interconnects may be formed above the devices or transistors, and in surrounding dielectric layers, and may be used to electrically couple the devices or transistors to form the integrated circuits 206. Materials making up the streets 207 may be similar to or the same as those materials used to form the integrated circuits 206. For example, streets 207 may be composed of layers of dielectric materials, semiconductor materials, and metallization. In one embodiment, one or more of the streets 207 includes test devices similar to the actual devices of the integrated circuits 206.

In an optional embodiment, the mask 202 is baked prior to laser patterning of the mask. In an embodiment, the mask 202 is baked to reduce the water content of the mask 202. In a specific embodiment, the mask 202 is baked at a temperature approximately in the range of 40 to 100 degrees Celsius. In one embodiment, baking is performed using a hot plate technique or a heat (light) radiation applied from the wafer front side (e.g., non-tape mounted side in the case of the use of a substrate carrier) or other suitable techniques.

Referring to operation 104 of Flowchart 100, and corresponding FIG. 2B, the mask 202 is patterned with a laser scribing process to provide patterned mask 208 with gaps 210, exposing regions of the semiconductor wafer or substrate 204 between the integrated circuits 206. As such, the laser scribing process is used to remove the material of the streets 207 originally formed between the integrated circuits 206. In accordance with an embodiment of the present disclosure, patterning the mask 202 with the laser scribing process further includes forming trenches 212 partially into the regions of the semiconductor wafer 204 between the integrated circuits 206, as is also depicted in FIG. 2B.

In an embodiment, the mask 202 is patterned with a Gaussian laser beam, however, non-Gaussian beams may also be used. Additionally, the beam may be stationary or rotating. In an embodiment, a femtosecond-based laser is used as a source for a laser scribing process. For example, in an embodiment, a laser with a wavelength in the visible spectrum plus the ultra-violet (UV) and infra-red (IR) ranges (totaling a broadband optical spectrum) is used to provide a femtosecond-based laser, i.e., a laser with a pulse width on the order of the femtosecond ($10^{-15}$ seconds). In one embodiment, ablation is not, or is essentially not, wavelength dependent and is thus suitable for complex films such as films of the mask 202, the streets 207 and, possibly, a portion of the semiconductor wafer or substrate 204.

It is to be appreciated that by using a laser beam profile with contributions from the femtosecond range, heat damage issues are mitigated or eliminated versus longer pulse widths (e.g., nanosecond processing). The elimination or mitigation of damage during laser scribing may be due to a lack of low energy recoupling or thermal equilibrium. It is also to be appreciated that laser parameter selection, such as beam profile, may be critical to developing a successful laser scribing and dicing process that minimizes chipping, microcracks and delamination in order to achieve clean laser scribe cuts. The cleaner the laser scribe cut, the smoother an etch process that may be performed for ultimate die singulation. In semiconductor device wafers, many functional layers of different material types (e.g., conductors, insulators, semiconductors) and thicknesses are typically disposed thereon. Such materials may include, but are not limited to, organic materials such as polymers, metals, or inorganic dielectrics such as silicon dioxide and silicon nitride.

A street between individual integrated circuits disposed on a wafer or substrate may include the similar or same layers as the integrated circuits themselves. For example, FIG. 4 illustrates a cross-sectional view of a stack of materials that may be used in a street region of a semiconductor wafer or substrate, in accordance with an embodiment of the present disclosure.

Figure 4:
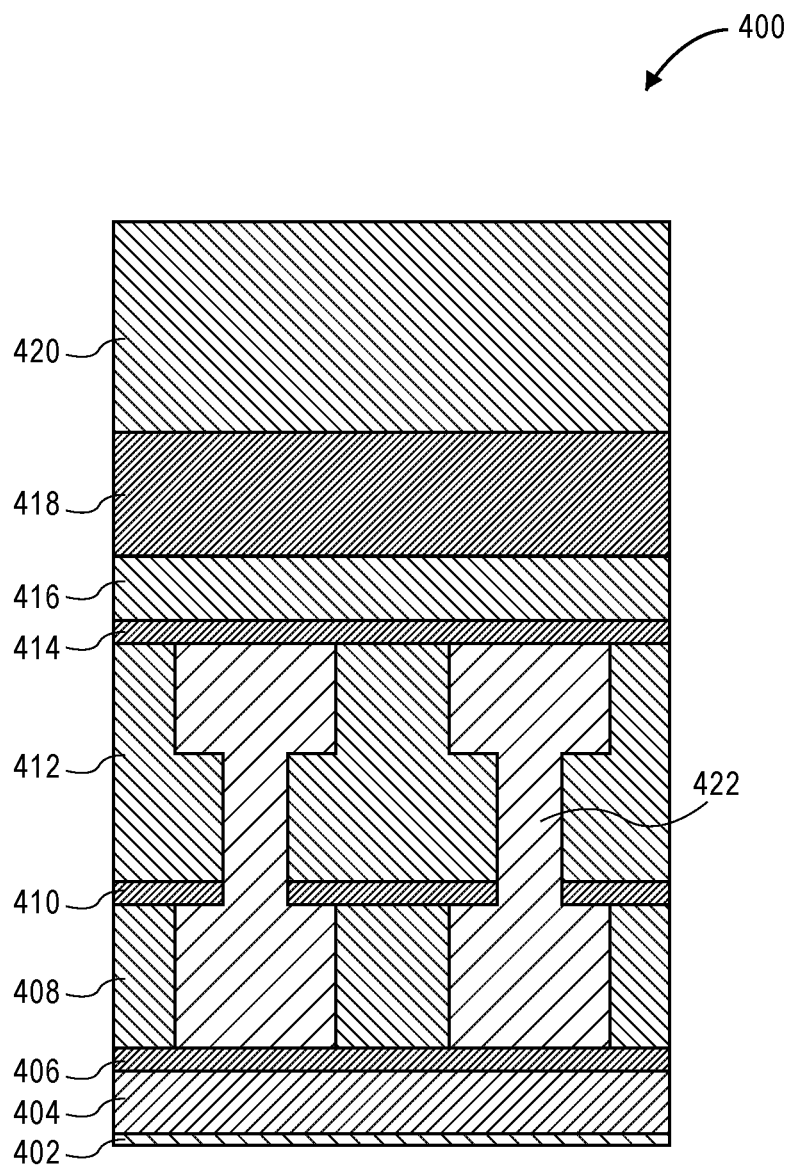
FIG. 4 illustrates a cross-sectional view of a stack of materials that may be used in a street region of a semiconductor wafer or substrate, in accordance with an embodiment of the present disclosure.

Referring to FIG. 4, a street region 400 includes the top portion 402 of a silicon substrate, a first silicon dioxide layer 404, a first etch stop layer 406, a first low K dielectric layer 408 (e.g., having a dielectric constant of less than the dielectric constant of 4.0 for silicon dioxide), a second etch stop layer 410, a second low K dielectric layer 412, a third etch stop layer 414, an undoped silica glass (USG) layer 416, a second silicon dioxide layer 418, and a scribing and/or etch mask 420 (such as a mask described above in association with mask 202). Copper metallization 422 is disposed between the first and third etch stop layers 406 and 414 and through the second etch stop layer 410. In a specific embodiment, the first, second and third etch stop layers 406, 410 and 414 are composed of silicon nitride, while low K dielectric layers 408 and 412 are composed of a carbon-doped silicon oxide material.

Under conventional laser irradiation (such as nanosecond-based irradiation), the materials of street 400 behave quite differently in terms of optical absorption and ablation mechanisms. For example, dielectrics layers such as silicon dioxide, is essentially transparent to all commercially available laser wavelengths under normal conditions. By contrast, metals, organics (e.g., low K materials) and silicon can couple photons very easily, particularly in response to nanosecond-based irradiation. In an embodiment, a femto-second based laser scribing process is used to pattern a layer of silicon dioxide, a layer of low K material, and a layer of copper by ablating the layer of silicon dioxide prior to ablating the layer of low K material and the layer of copper.

In case that the laser beam it is a femtosecond-based laser beam, in an embodiment, suitable femtosecond-based laser processes are characterized by a high peak intensity (irradiance) that usually leads to nonlinear interactions in various materials. In one such embodiment, the femtosecond laser sources have a pulse width approximately in the range of 10 femtoseconds to 500 femtoseconds, although preferably in the range of 100 femtoseconds to 400 femtoseconds. In one embodiment, the femtosecond laser sources have a wavelength approximately in the range of 1570 nanometers to 200 nanometers, although preferably in the range of 540 nanometers to 250 nanometers. In one embodiment, the laser and corresponding optical system provide a focal spot at the work surface approximately in the range of 3 microns to 15 microns, though preferably approximately in the range of 5 microns to 10 microns or between 10-15 microns.

In an embodiment, the laser source has a pulse repetition rate approximately in the range of 200 kHz to 10 MHz, although preferably approximately in the range of 500 kHz to 5 MHz. In an embodiment, the laser source delivers pulse energy at the work surface approximately in the range of 0.5 uJ to 100 uJ, although preferably approximately in the range of 1 uJ to 5 uJ. In an embodiment, the laser scribing process runs along a work piece surface at a speed approximately in the range of 500 mm/sec to 5 m/sec, although preferably approximately in the range of 600 mm/sec to 2 m/sec.

The scribing process may be run in single pass only, or in multiple passes, but, in an embodiment, preferably 1-2 passes. In one embodiment, the scribing depth in the work piece is approximately in the range of 5 microns to 50 microns deep, preferably approximately in the range of 10 microns to 20 microns deep. In an embodiment, the kerf width of the laser beam generated is approximately in the range of 2 microns to 15 microns, although in silicon wafer scribing/dicing preferably approximately in the range of 6 microns to 10 microns, measured at the device/silicon interface.

Laser parameters may be selected with benefits and advantages such as providing sufficiently high laser intensity to achieve ionization of inorganic dielectrics (e.g., silicon dioxide) and to minimize delamination and chipping caused by underlayer damage prior to direct ablation of inorganic dielectrics. Also, parameters may be selected to provide meaningful process throughput for industrial applications with precisely controlled ablation width (e.g., kerf width) and depth.

It is to be appreciated that the dicing or singulation process could be stopped after the above described laser scribing in a case that the laser scribing is used to pattern the mask as well as to scribe fully through the wafer or substrate in order to singulate the dies. In accordance with such an approach, in an embodiment, a method of dicing a semiconductor wafer including a plurality of integrated circuits involves forming a mask above the semiconductor wafer. The mask includes a water-soluble matrix based on a solid component and water, and a p-block metal compound, an s-block metal compound, or a transition metal compound dissolved throughout the water-soluble matrix. The mask is patterned and the integrated circuits of the semiconductor wafer are singulated with a laser scribing process. The laser scribing completes the singulation.

Accordingly, in an embodiment, further singulation processing such as plasma etching to effect singulation is not required. However, the embodiments that follow may be considered in cases where laser scribing alone is not implemented for total singulation.

In an optional embodiment, subsequent to the laser scribing process and prior to a plasma etching singulation process, an intermediate post mask-opening cleaning operation is performed. In an embodiment, the post mask-opening cleaning operation is a plasma-based cleaning process. In an example, as described below, the plasma-based cleaning process is non-reactive to the trenches 212 of the substrate 204 exposed by the gaps 210.

In accordance with one embodiment, the plasma-based cleaning process is non-reactive to exposed regions of the substrate 204 in that the exposed regions are not or only negligible etched during the cleaning process. In one such embodiment, only non-reactive gas plasma cleaning is used. For example, Ar or another non-reactive gas (or the mix) is used to perform a highly-biased plasma treatment both for mask condensation and cleaning of scribed openings. The approach may be suitable for water-soluble masks such as mask 202. In another such embodiment, separate mask condensation (densification of the surface layer) and scribed trench cleaning operations are used, e.g., an Ar or non-reactive gas (or the mix) highly-biased plasma treatment for mask condensation is first performed, and then an Ar+$SF_6$ plasma cleaning of a laser scribed trench is performed. This embodiment may be suitable for cases where Ar-cleaning is not sufficient for trench cleaning due to too thick of a mask material. In this case, metal compounds of the mask may provide etch resistance during a plasma cleaning operation including $SF_6$.

Referring to operation 106 of Flowchart 100, and corresponding FIG. 2C, the semiconductor wafer 204 is etched through the gaps 210 in the patterned mask 208 to singulate the integrated circuits 206. In accordance with an embodiment of the present disclosure, etching the semiconductor wafer 204 includes ultimately etching entirely through semiconductor wafer 204, as depicted in FIG. 2C, by etching the trenches 212 initially formed with the laser scribing process. The patterned mask 208 protects the integrated circuits during the plasma etching.

In accordance with an embodiment of the present disclosure, plasma etching the semiconductor wafer through the gaps involves plasma etching a single crystalline silicon wafer. In one such embodiment, a ratio of an etch rate of the single crystalline silicon wafer to an etch rate of the mask 202 is approximately in the range of 36:1-140:1 during the plasma etching. In an embodiment, mask 202 includes a water-soluble matrix based on a solid component and water, and a p-block metal compound, an s-block metal compound, or a transition metal compound dissolved throughout the water-soluble matrix. In one such embodiment, plasma etching the semiconductor wafer involves using a fluorine-based etch chemistry, and the p-block metal compound, the s-block metal compound, or the transition metal compound is resistant to the fluorine-based etch chemistry.

In one aspect, the etch selectivity (e.g., to a fluorine-based chemistry) of the hybrid mask with a polymer to metal compound ratio of 2:1 is about 10 times higher than the etch selectivity of polymer-only mask. To provide a variety of exemplary compositions, FIG. 3 is a Table 300 including parameters of materials ratio by weight, etched trench depth in silicon, mark loss during etch, and etch selectivity, in accordance with an embodiment of the present disclosure. For Table 300, PVA is poly(vinyl alcohol), PVP is poly(vinyl pyrrolidone), Al is aluminum acetate dibasic, stabilized by boric acid. With reference to Table 300, the ratio of metal compound to polymer shows that a high metal compound to polymer ratio provides high etch selectivity, however, if the ratio of metal compound to polymers is too high the dry film becomes inhomogeneous and loses optical clarity. In one embodiment, the ratio of aluminum acetate dibasic to PVA is less than 1:1.

The etch selectivity of comparative mask materials may be measured by (1) coating bare Si wafers with different materials and performing a bake, (2) laser scribing to open the mask material, (3) covering small areas of the mask with Kapton tape to maintain an as-coated condition during etch, (4) plasma etching to achieve the desired trench etch depth in the Si, (5) removing the Kapton tape, and (6) cleaving/cross-sectioning the wafers into samples to obtain scanning electron micrograph (SEM) images and measurements of the Si etch depth and the mask material thickness pre-etch (under the Kapton tape) and post-etch (outside of the Kapton tape).

In an embodiment, patterning the mask 202 with the laser scribing process involves forming trenches in the regions of the semiconductor wafer between the integrated circuits, and plasma etching the semiconductor wafer involves extending the trenches to form corresponding trench extensions. In one such embodiment, each of the trenches has a width, and each of the corresponding trench extensions has the width.

In an embodiment, etching the semiconductor wafer 204 includes using a plasma etching process. In one embodiment, a through-silicon via type etch process is used. For example, in a specific embodiment, the etch rate of the material of semiconductor wafer 204 is greater than 25 microns per minute. An ultra-high-density plasma source may be used for the plasma etching portion of the die singulation process. An example of a process chamber suitable to perform such a plasma etch process is the Applied Centura® Silvia™ Etch system available from Applied Materials of Sunnyvale, Calif., USA. The Applied Centura® Silvia™ Etch system combines the capacitive and inductive RF coupling, which gives much more independent control of the ion density and ion energy than was possible with the capacitive coupling only, even with the improvements provided by magnetic enhancement. This combination enables effective decoupling of the ion density from ion energy, so as to achieve relatively high density plasmas without the high, potentially damaging, DC bias levels, even at very low pressures. This results in an exceptionally wide process window. However, any plasma etch chamber capable of etching silicon may be used. In an exemplary embodiment, a deep silicon etch is used to etch a single crystalline silicon substrate or wafer 204 at an etch rate greater than approximately 40% of conventional silicon etch rates while maintaining essentially precise profile control and virtually scallop-free sidewalls. In a specific embodiment, a through-silicon via type etch process is used. The etch process is based on a plasma generated from a reactive gas, which generally a fluorine-based gas such as $SF_6$, $C_4F_8$, $CHF_3$, $XeF_2$, or any other reactant gas capable of etching silicon at a relatively fast etch rate. In an embodiment, the water soluble patterned mask 208 is removed after the singulation process, as depicted in FIG. 2C, and as is described in greater detail below. In another embodiment, the plasma etching operation described in association with FIG. 2C employs a conventional Bosch-type dep/etch/dep process to etch through the substrate 204. Generally, a Bosch-type process consists of three sub-operations: deposition, a directional bombardment etch, and isotropic chemical etch which is run through many iterations (cycles) until silicon is etched through.

In an embodiment, following the singulation process, the patterned mask 208 is removed. In an embodiment, the patterned mask 208 is removed using an aqueous solution. In one such embodiment, the patterned mask 208 is removed by a hot aqueous treatment, such as a hot water treatment. In a specific embodiment, the patterned mask 208 is removed in a hot water treatment at a temperature approximately in the range of 40-100 degrees Celsius. In a particular embodiment, the patterned mask 208 is removed in a hot water treatment at a temperature approximately in the range of 80-90 degrees Celsius. It is to be appreciated that the hotter the temperature of the water, the less time may be needed for the hot water treatment. In accordance with an embodiment of the present disclosure, a plasma cleaning process can also be performed after etching to aid in the removal of the patterned mask 208.

It is to be appreciated that other circumstances may benefit from a lower water treatment temperature. For example, in the case that a wafer for dicing is supported on a dicing tape that may be impacted by a higher temperature water treatment (e.g., through loss of adhesion), a relatively lower water treatment temperature may be employed, albeit for a longer duration that a relatively higher water treatment temperature. In one such embodiment, the water treatment is between room temperature (i.e., the water is un-heated), but below a temperature of approximately 40 degrees Celsius. In a specific such embodiment, the patterned mask 208 is removed in a warm water treatment at a temperature approximately in the range of 35-40 degrees Celsius.

Accordingly, referring again to Flowchart 100 and FIGS. 2A-2C, wafer dicing may be preformed by initial ablation to ablate through an mask 202, through wafer streets (including metallization), and partially into a silicon substrate. Die singulation may then be completed by subsequent through-silicon deep plasma etching. A specific example of a materials stack for dicing is described below in association with FIGS. 5A-5D, in accordance with an embodiment of the present disclosure.

Figure 5A:
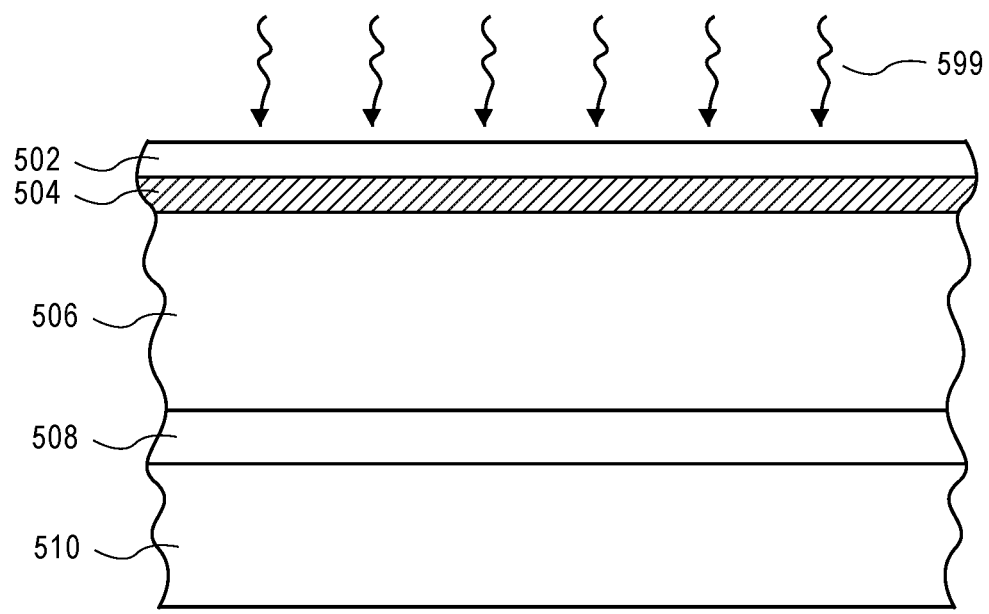
FIGS. 5A-5D illustrate cross-sectional views of various operations in a method of dicing a semiconductor wafer, in accordance with an embodiment of the present disclosure.

Referring to FIG. 5A, a materials stack for hybrid laser ablation and plasma etch dicing includes a mask 502, a device layer 504, and a substrate 506. The mask layer 502, device layer 504, and substrate 506 are disposed above a die attach film 508 which is affixed to a backing tape 510. In other embodiments, direct coupling to a standard dicing tape is used. In an embodiment, the mask 502 is one such as described above in association with mask 202. The device layer 504 includes an inorganic dielectric layer (such as silicon dioxide) disposed above one or more metal layers (such as copper layers) and one or more low K dielectric layers (such as carbon-doped oxide layers). The device layer 504 also includes streets arranged between integrated circuits, the streets including the same or similar layers to the integrated circuits. The substrate 506 is a bulk single-crystalline silicon substrate. In an embodiment, the mask 502 is fabricated using a thermal treatment or bake 599, such as described above. In an embodiment, the mask 502 is a water soluble organic-inorganic hybrid mask, such as described above.

In an embodiment, the bulk single-crystalline silicon substrate 506 is thinned from the backside prior to being affixed to the die attach film 508. The thinning may be performed by a backside grind process. In one embodiment, the bulk single-crystalline silicon substrate 506 is thinned to a thickness approximately in the range of 50-100 microns. It is important to note that, in an embodiment, the thinning is performed prior to a laser ablation and plasma etch dicing process. In an embodiment, the mask 502 has a thickness approximately in the range of 1-5 microns and the device layer 504 has a thickness approximately in the range of 2-3 microns. In an embodiment, the die attach film 508 (or any suitable substitute capable of bonding a thinned or thin wafer or substrate to the backing tape 510, such as dicing tapes consisting of an upper adhesive layer and a base film) has a thickness approximately in the range of 10-200 microns.

Figure 5B:
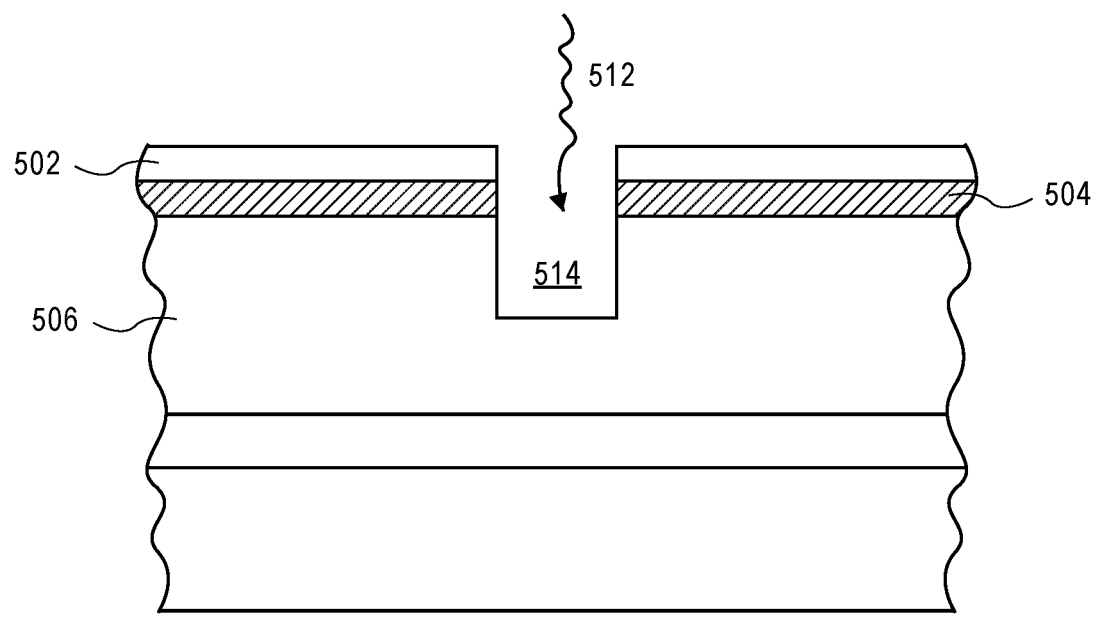

Referring to FIG. 5B, the mask 502, the device layer 504 and a portion of the substrate 506 are patterned with a laser scribing process 512 to form trenches 514 in the substrate 506.

Figure 5C:
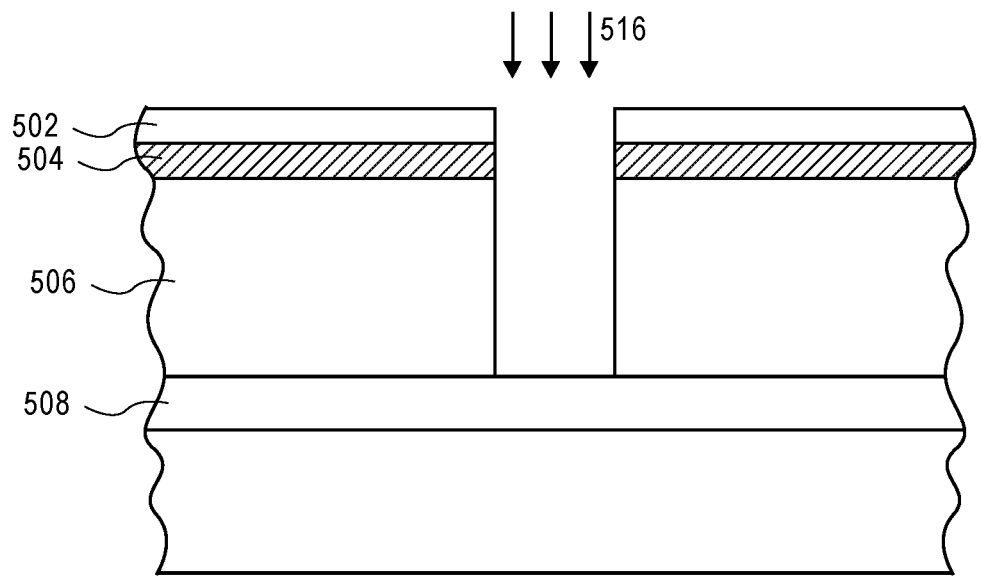

Referring to FIG. 5C, a through-silicon deep plasma etch process 516 is used to extend the trench 514 down to the die attach film 508, exposing the top portion of the die attach film 508 and singulating the silicon substrate 506. The device layer 504 is protected by the mask 502 during the through-silicon deep plasma etch process 516.

Figure 5D:
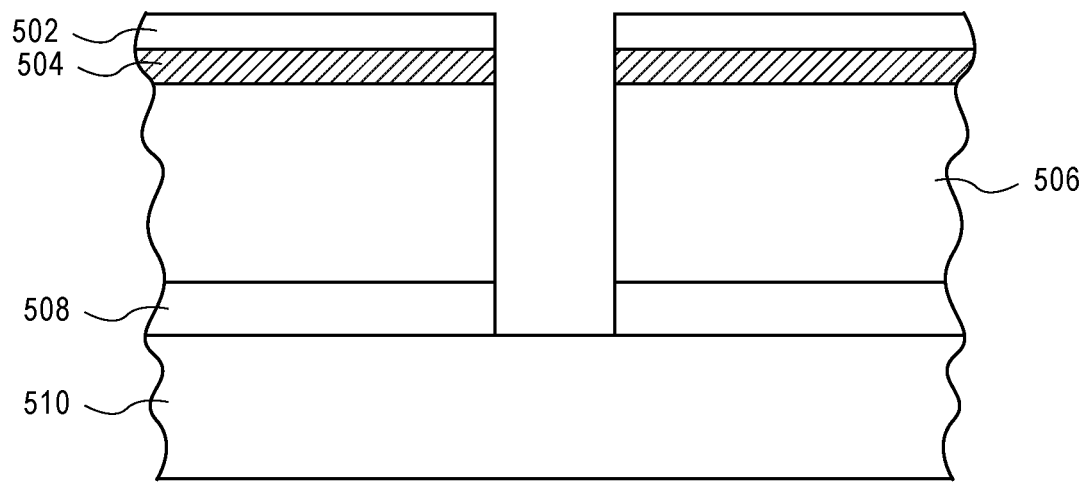

Referring to FIG. 5D, the singulation process may further include patterning the die attach film 508, exposing the top portion of the backing tape 510 and singulating the die attach film 508. In an embodiment, the die attach film is singulated by a laser process or by an etch process. Further embodiments may include subsequently removing the singulated portions of substrate 506 (e.g., as individual integrated circuits) from the backing tape 510. In one embodiment, the singulated die attach film 508 is retained on the back sides of the singulated portions of substrate 506. In an alternative embodiment, in the case that substrate 506 is thinner than approximately 50 microns, the laser scribing process 512 is used to completely singulate substrate 506 without the use of an additional plasma process. Embodiments may further include removing the mask 502 from the device layer 504. Removal of the mask 502 can be as described above for removal of the patterned mask 208.

A single process tool may be configured to perform many or all of the operations in a hybrid laser ablation and plasma etch singulation process utilizing an etch resistant water soluble mask. For example, FIG. 6 illustrates a block diagram of a tool layout for laser and plasma dicing of wafers or substrates, in accordance with an embodiment of the present disclosure.

Figure 6:
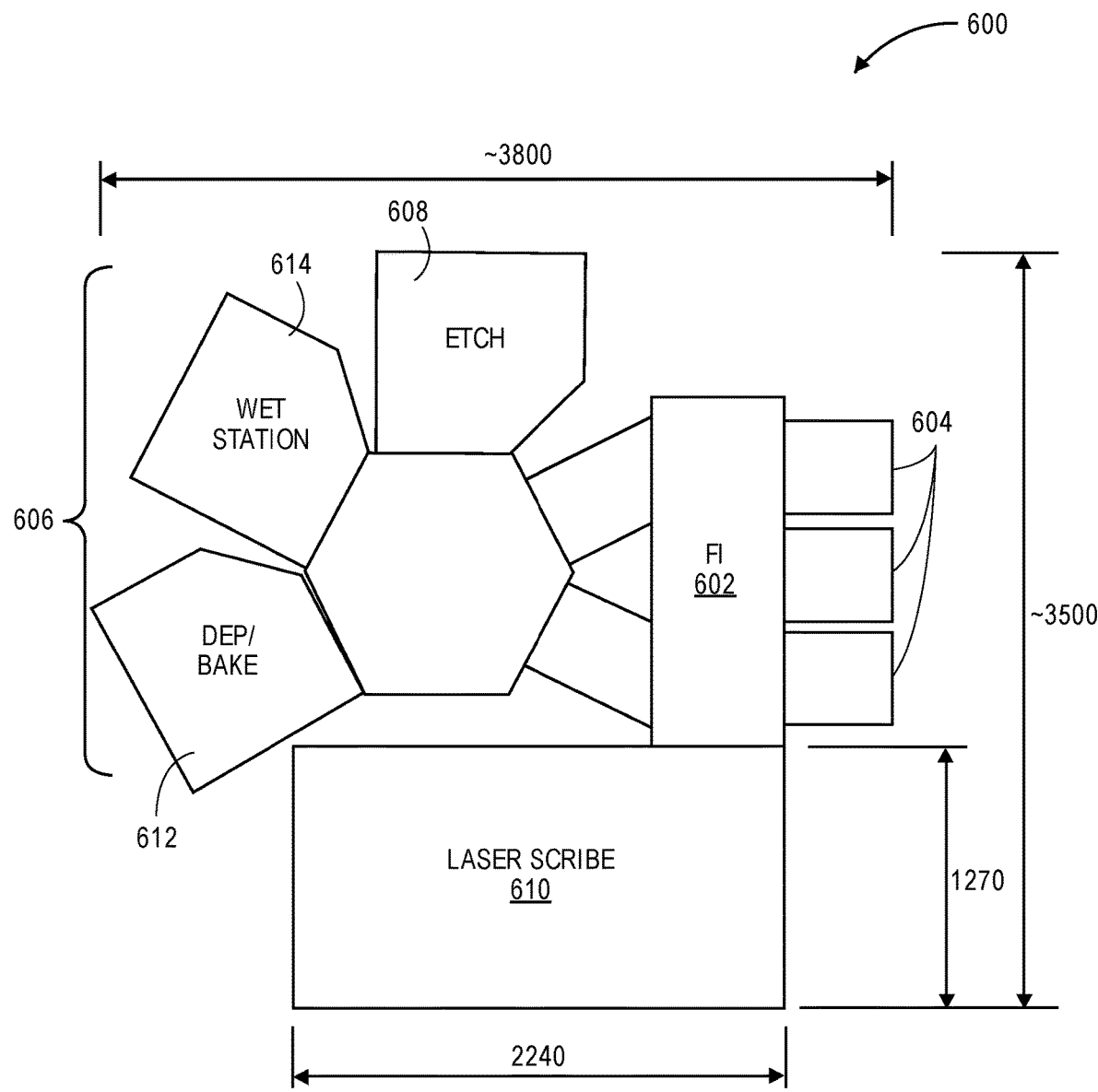
FIG. 6 illustrates a block diagram of a tool layout for laser and plasma dicing of wafers or substrates, in accordance with an embodiment of the present disclosure.

Referring to FIG. 6, a process tool 600 includes a factory interface 602 (FI) having a plurality of load locks 604 coupled therewith. A cluster tool 606 is coupled with the factory interface 602. The cluster tool 606 includes one or more plasma etch chambers, such as plasma etch chamber 608. A laser scribe apparatus 610 is also coupled to the factory interface 602. The overall footprint of the process tool 600 may be, in one embodiment, approximately 3500 millimeters (3.5 meters) by approximately 3800 millimeters (3.8 meters), as depicted in FIG. 6.

In an embodiment, the laser scribe apparatus 610 houses a laser assembly configured to provide a femto-second based laser beam. In an embodiment, the laser is suitable for performing a laser ablation portion of a hybrid laser and etch singulation process, such as the laser ablation processes described above. In one embodiment, a moveable stage is also included in laser scribe apparatus 610, the moveable stage configured for moving a wafer or substrate (or a carrier thereof) relative to the laser. In a specific embodiment, the laser is also moveable. The overall footprint of the laser scribe apparatus 610 may be, in one embodiment, approximately 2240 millimeters by approximately 1270 millimeters, as depicted in FIG. 6.

In an embodiment, the one or more plasma etch chambers 608 is configured for etching a wafer or substrate through the gaps in a patterned mask to singulate a plurality of integrated circuits. In one such embodiment, the one or more plasma etch chambers 608 is configured to perform a deep silicon etch process. In a specific embodiment, the one or more plasma etch chambers 608 is an Applied Centura® Silvia™ Etch system, available from Applied Materials of Sunnyvale, Calif., USA. The etch chamber may be specifically designed for a deep silicon etch used to create singulate integrated circuits housed on or in single crystalline silicon substrates or wafers. In an embodiment, a high-density plasma source is included in the plasma etch chamber 608 to facilitate high silicon etch rates. In an embodiment, more than one etch chamber is included in the cluster tool 606 portion of process tool 600 to enable high manufacturing throughput of the singulation or dicing process.

The factory interface 602 may be a suitable atmospheric port to interface between an outside manufacturing facility with laser scribe apparatus 610 and cluster tool 606. The factory interface 602 may include robots with arms or blades for transferring wafers (or carriers thereof) from storage units (such as front opening unified pods) into either cluster tool 606 or laser scribe apparatus 610, or both.

Cluster tool 606 may include other chambers suitable for performing functions in a method of singulation. For example, in one embodiment, a deposition and/or bake chamber 612 is included. The deposition and/or bake chamber 612 may be configured for mask deposition on or above a device layer of a wafer or substrate prior to laser scribing of the wafer or substrate. Such a mask material may be baked prior to the dicing process, as is described above. Such a mask material may be water soluble, as is also described above. Such as mask may include a p-block metal compound, an s-block metal compound, or a transition metal compound dissolved throughout the water-soluble matrix In an embodiment, referring again to FIG. 6, a wet station 614 is included. The wet station may be suitable for cleaning performing a room temperature or a hot aqueous treatment for removing an etch resistant water soluble mask, as is described above, subsequent to a laser scribe and plasma etch singulation process of a substrate or wafer, or subsequent to a laser scribe-only singulation process. In an embodiment, although not depicted, a metrology station is also included as a component of process tool 600. The cleaning chamber can include atomized mist and/or megasonics nozzle hardware that adds a physical component to the cleaning process, enhancing the dissolution rate of the mask. In other embodiments, a separate system/module is used for coat, bake, and/or clean (mask removal) operations.

Embodiments of the present disclosure may be provided as a computer program product, or software, that may include a machine-readable medium having stored thereon instructions, which may be used to program a computer system (or other electronic devices) to perform a process according to embodiments of the present disclosure. In one embodiment, the computer system is coupled with process tool 600 described in association with FIG. 6. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 7:
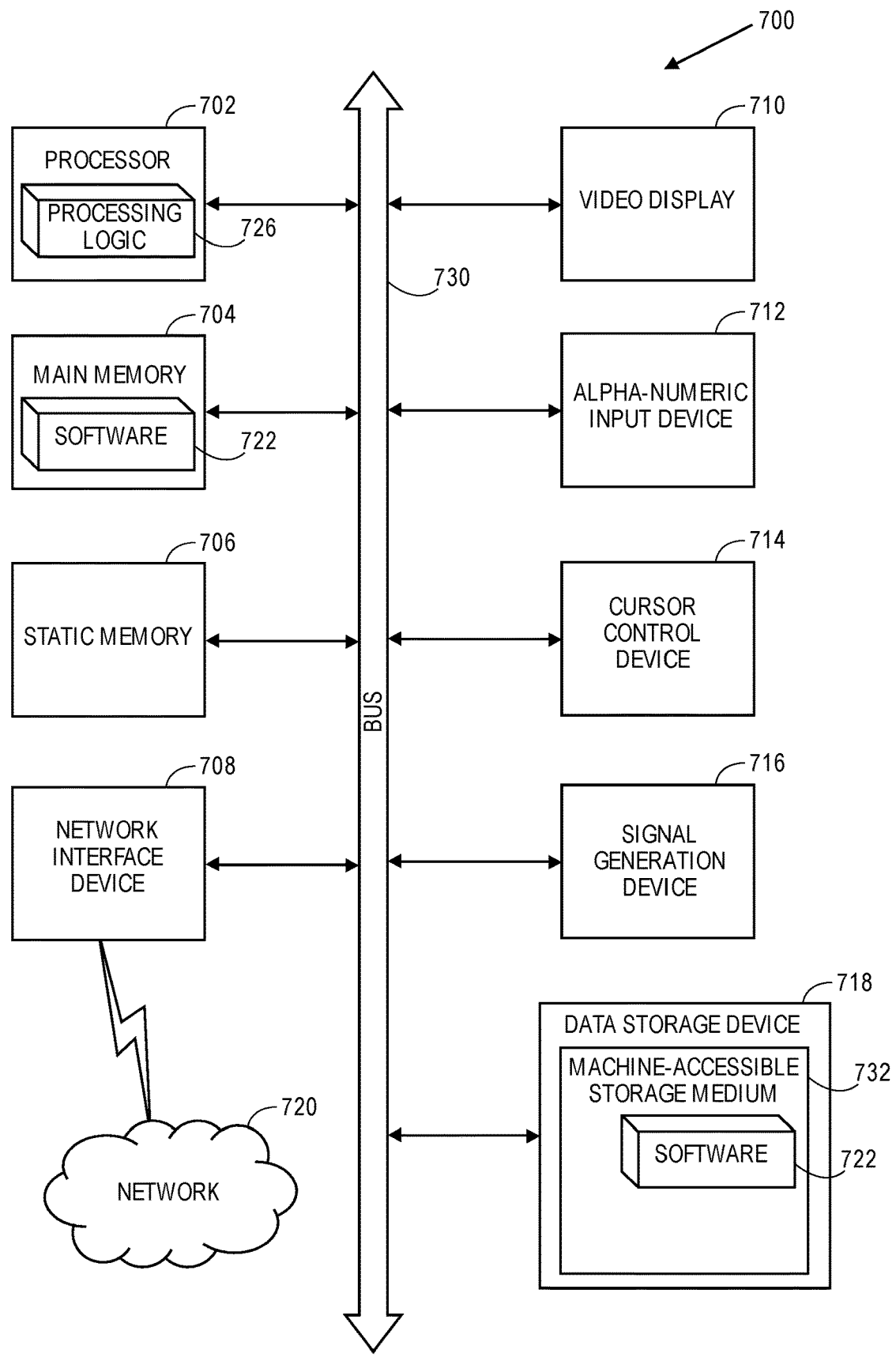
FIG. 7 illustrates a block diagram of an exemplary computer system, in accordance with an embodiment of the present disclosure.

FIG. 7 illustrates a diagrammatic representation of a machine in the exemplary form of a computer system 700 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 700 includes a processor 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a secondary memory 718 (e.g., a data storage device), which communicate with each other via a bus 730.

Processor 702 represents one or more general-purpose processing devices such as a microprocessor, central processing unit, or the like. More particularly, the processor 702 may be a complex instruction set computing (CISC) microprocessor, reduced instruction set computing (RISC) microprocessor, very long instruction word (VLIW) microprocessor, processor implementing other instruction sets, or processors implementing a combination of instruction sets.

Processor 702 may also be one or more special-purpose processing devices such as an application specific integrated circuit (ASIC), a field programmable gate array (FPGA), a digital signal processor (DSP), network processor, or the like. Processor 702 is configured to execute the processing logic 726 for performing the operations described herein.

The computer system 700 may further include a network interface device 708. The computer system 700 also may include a video display unit 710 (e.g., a liquid crystal display (LCD), a light emitting diode display (LED), or a cathode ray tube (CRT)), an alphanumeric input device 712 (e.g., a keyboard), a cursor control device 714 (e.g., a mouse), and a signal generation device 716 (e.g., a speaker).

The secondary memory 718 may include a machine-accessible storage medium (or more specifically a computer-readable storage medium) 732 on which is stored one or more sets of instructions (e.g., software 722) embodying any one or more of the methodologies or functions described herein. The software 722 may also reside, completely or at least partially, within the main memory 704 and/or within the processor 702 during execution thereof by the computer system 700, the main memory 704 and the processor 702 also constituting machine-readable storage media. The software 722 may further be transmitted or received over a network 720 via the network interface device 708.

While the machine-accessible storage medium 732 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, and optical and magnetic media.

In accordance with an embodiment of the present disclosure, a machine-accessible storage medium has instructions stored thereon which cause a data processing system to perform a method of dicing a semiconductor wafer having a plurality of integrated circuits, such as one or more of the methods described herein.

Thus, mask formulations and hybrid wafer dicing approaches using a laser scribing process and plasma etch process implementing a water soluble organic-inorganic hybrid mask have been disclosed.

What is claimed is:

1. A mask for a wafer singulation process, the mask comprising:
   a water-soluble matrix based on a solid component and water; and
   a p-block metal compound dissolved throughout the water-soluble matrix.

2. The mask of claim 1, wherein the p-block metal compound comprises an aluminum cation.

3. The mask of claim 1, wherein the p-block metal compound comprises a tin cation.

4. The mask of claim 1, wherein the p-block metal compound comprises an acetate anion.

5. The mask of claim 1, wherein the solid component of the water-soluble matrix is poly(vinyl alcohol) (PVA).

6. The mask of claim 5, wherein the water-soluble matrix further comprises poly(vinyl pyrrolidone), a dye, a corrosion inhibitor, or a pH adjuster.

7. A mask for a wafer singulation process, the mask comprising:
   a water-soluble matrix based on a solid component and water; and
   an s-block metal compound dissolved throughout the water-soluble matrix, wherein the s-block metal compound comprises an acetate anion.

8. The mask of claim 7, wherein the s-block metal compound comprises a potassium cation.

9. The mask of claim 7, wherein the s-block metal compound comprises a calcium cation.

10. The mask of claim 7, wherein the solid component of the water-soluble matrix is poly(vinyl alcohol) (PVA).

11. The mask of claim 10, wherein the water-soluble matrix further comprises poly(vinyl pyrrolidone), a dye, a corrosion inhibitor, or a pH adjuster.

12. A mask for a wafer singulation process, the mask comprising:
   a water-soluble matrix based on a solid component and water; and
   a transition metal compound dissolved throughout the water-soluble matrix, wherein the transition metal compound comprises an acetate anion.

13. The mask of claim 12, wherein the transition metal compound comprises a copper cation.

14. The mask of claim 12, wherein the transition metal compound comprises a nickel cation.

15. The mask of claim 12, wherein the transition metal compound comprises a silver cation.

16. The mask of claim 12, wherein the transition metal compound comprises a chromium cation.

17. The mask of claim 12, wherein the solid component of the water-soluble matrix is poly(vinyl alcohol) (PVA).

18. The mask of claim 17, wherein the water-soluble matrix further comprises poly(vinyl pyrrolidone), a dye, a corrosion inhibitor, or a pH adjuster.

19. A mask for a wafer singulation process, the mask comprising:
   a water-soluble matrix based on a solid component and water; and
   an s-block metal compound dissolved throughout the water-soluble matrix, wherein the s-block metal compound comprises a calcium cation.

20. A mask for a wafer singulation process, the mask comprising:
   a water-soluble matrix based on a solid component and water; and
   a transition metal compound dissolved throughout the water-soluble matrix, wherein the transition metal compound comprises a copper cation.

21. A mask for a wafer singulation process, the mask comprising:
   a water-soluble matrix based on a solid component and water; and
   a transition metal compound dissolved throughout the water-soluble matrix, wherein the transition metal compound comprises a nickel cation.

22. A mask for a wafer singulation process, the mask comprising:
   a water-soluble matrix based on a solid component and water; and
   a transition metal compound dissolved throughout the water-soluble matrix, wherein the transition metal compound comprises a chromium cation.

* * * * *